United States Patent
Katayama et al.

[11] Patent Number: 6,161,748
[45] Date of Patent: Dec. 19, 2000

[54] PROCESS FOR MANUFACTURING ELECTRONIC CIRCUITS

[75] Inventors: Kaoru Katayama; Hiroshi Fukuda; Shinichi Kazui; Toshihiko Ohta; Yasuhiro Iwata; Mitsugu Shirai; Mitsunori Tamura, all of Hadano, Japan

[73] Assignee: Hitachi, Ltd., Tokyo, Japan

[21] Appl. No.: 09/538,515

[22] Filed: Mar. 30, 2000

Related U.S. Application Data

[62] Division of application No. 09/322,998, Jun. 1, 1999, which is a division of application No. 08/647,672, May 15, 1996, Pat. No. 5,940,728.

[30] Foreign Application Priority Data

May 19, 1995 [JP] Japan .................................... 7-121118

[51] Int. Cl.⁷ ............................... B23K 1/00; B23K 31/02
[52] U.S. Cl. .................................... 228/8; 228/6.2; 228/33
[58] Field of Search ............................. 228/8, 9, 10, 6.2, 228/33, 36

[56] References Cited

U.S. PATENT DOCUMENTS

| | | | |
|---|---|---|---|
| 4,208,005 | 6/1980 | Nate et al. | 228/175 |
| 4,890,781 | 1/1990 | Johnson et al. | 228/7 |
| 4,948,032 | 8/1990 | Dunaway et al. | 228/223 |
| 4,995,921 | 2/1991 | Davis et al. | 148/22 |
| 5,176,307 | 1/1993 | Hagerty et al. | 228/37 |
| 5,205,032 | 4/1993 | Kuroda et al. | 29/740 |
| 5,232,674 | 8/1993 | Mukai et al. . | |
| 5,297,333 | 3/1994 | Kusaka | 29/840 |
| 5,341,980 | 8/1994 | Nishikawa et al. | 228/205 |
| 5,433,785 | 7/1995 | Saito . | |
| 5,451,274 | 9/1995 | Gupta . | |
| 5,497,258 | 3/1996 | Ju et al. | 359/83 |
| 5,499,668 | 3/1996 | Katayama et al. . | |
| 5,531,838 | 7/1996 | Arldt et al. | 148/23 |
| 5,735,961 | 4/1998 | Shimada . | |
| 5,801,350 | 9/1998 | Shibuya et al. | 204/157.15 |
| 5,816,473 | 10/1998 | Nishikawa et al. | 228/6.2 |
| 5,865,365 | 2/1999 | Nishikawa et al. | 228/223 |
| 5,878,943 | 3/1999 | Nishikawa et al. | 228/205 |
| 5,940,728 | 8/1999 | Katayama et al. . | |
| 5,976,302 | 11/1999 | Oppermann et al. | 156/299 |
| 6,059,894 | 5/2000 | Pendse | 148/23 |

FOREIGN PATENT DOCUMENTS

| | | |
|---|---|---|
| 62-256961 | 11/1987 | Japan . |
| 63-97382 | 4/1988 | Japan . |
| 6-87067 | 3/1994 | Japan . |
| 7-99382 | 4/1995 | Japan . |

*Primary Examiner*—Patrick Ryan
*Assistant Examiner*—Kiley Stoner
*Attorney, Agent, or Firm*—Mattingly, Stanger & Malur, P.C.

[57] ABSTRACT

The process for manufacturing an electronic circuit includes disposing an electronic device on a circuit substrate and hot melting a solder formed on the electronic device or the circuit substrate to bond the electronic device and the circuit substrate. The process includes the steps of feeding a liquid onto lands on the circuit substrate, aligning and mounting the electronic device on the lands, placing the circuit substrate in a treating vessel and heating the circuit substrate. The heating step includes controlling a pressure of an atmosphere in the treating vessel, hot-melting the solder to prevent at least a portion of the liquid from evaporating until the electronic device and the circuit substrate are bonded and to permit the liquid to evaporate after the electronic device and the circuit substrate are bonded.

5 Claims, 12 Drawing Sheets

FIG. 21

|   | LIQUID | BOILING POIMT (°C) |
|---|--------|--------------------|
| A | ETHYLENE GLYCOL | 197 |
| B | TRIETHYLENE GLYCOL | 287 |

PROCESS FOR MANUFACTURING ELECTRONIC CIRCUITS

This is a divisional application of U.S. Ser. No. 09/322,998, filed Jun. 1, 1999, which is a divisional application of U.S. Ser. No. 08/647,672, now U.S. Pat. No. 5,940,728 filed May 15, 1996.

BACKGROUND OF THE INVENTION

This invention relates to a process for manufacturing an electronic circuit wherein an electronic device or component (part) such as a semiconductor integrated circuit (LSI) is connected to a circuit substrate, especially by soldering without using flux.

Soldering between a circuit substrate and a semiconductor integrated circuit (LSI) or the like has required that the surfaces of the metals in question to be joined should be kept clean and free from any material hindering wettability.

Plating has also required that the surface of the metal in question to be plated should be kept clean so that an oxide film or layer or the like does not exist thereon.

When an Au wire or Au ribbon or the like is to be bonded on the surface of the metal in question by an ultrasonic heat pressure technique, an oxide film on the surface of the metal in question is also troublesome and therefore the surface of the metal in question must be kept clean.

The materials hindering wettability of solder include oxides, chlorides, sulfides, carbonates, various types of organic compounds, etc. Particularly, the most serious obstacle in the processes such as soldering, plating or ultrasonic heat pressure bonding of an Au wire or Au ribbon is an oxide film present on the surface of the metal in question such as solder, nickel (Ni), nickel alloys (alloys of nickel with other substances).

An oxide film is usually chemically dissolved by flux and converted into a liquid compound. Thus, the surface of the metal in question and metal atoms of solder get an opportunity to directly collide with each other to form a metallic bonding state sharing an outer electron shell, so that the metal in question and solder can be alloyed. However, flux residues still remain on the surface and must be cleaned off.

The presence of an oxide film hinders plating. For example, an oxide film acts as an insulating (dielectric) film to prevent electric conduction therethrough necessary for electroplating, which is a typical example of plating, and thus hinders such electroplating.

Oxide film also hinders replacement plating by preventing the reaction between the surface of the metal in question and a plating liquid.

In these plating processes, oxide film should be removed by liquid treatment with hydrochloric acid or the like. However, residues still remain and are largely responsible for lowering the bonding reliability. Residues have been conventionally cleaned off with chlorofluorocarbons.

Recently, a technology has been developed to omit the step of cleaning off flux residues by using abietic acid (rosin) which leaves a lesser amount of residues as flux and a minor amount of adipic acid or the like. However, the bonding reliability is insufficient.

This technology is described in detail in "Alumit Technical Journal 19" (1992) and "Action Mechanism and Problems of Cleaning-Free Flux" by Kubota of Japan Industrial Technology Development Research Institute, Co.

A glazing method has also been proposed, which provides highly corrosion- and abrasion-resistant materials with very fine homogeneous texture or amorphous structure by irradiating metallic materials, steel materials, carbides or the like with laser beam. This glazing method is used for processing metallic materials to be subjected to high temperatures and high pressures such as materials for automobile turbines, and discussed in, for example, "Laser Processing, Second Series", by A. Kobayashi, pp. 164, published by Kaihatsusha.

A known method for removing oxide film on the surfaces of metals without using flux or hydrochloric acid employs argon sputtering.

Japanese Patent Application Laying Open (KOKAI or Unexamined Publication) No. 63-97382 discloses a method for providing a highly adhesive pinhole-free coating film by plating a surface of, a metallic workpiece, roughened by blasting with an alloy element, and thereafter melt processing the plated layer by irradiation with a laser beam.

Further, Japanese Patent Application Laying Open (KOKAI) 62-256961 discloses a method for preparing a surface-treated layer with good corrosion resistance and solderability by forming an anodized layer on the surface of a base material formed of aluminium or alloys thereof.

SUMMARY OF THE INVENTION

As a result of reviews and studies of the above prior art, the inventors have found the following problems.

(1) The method for removing oxide film by means of flux before soldering a circuit substrate and an integrated circuit involves the problem of necessarily requiring the step of cleaning off flux residues. Acid or the like remaining as residues may also cause the corrosion of metal.

In addition, a drying step is indispensable after cleaning.

(2) The method for removing oxide film by argon sputtering involves the problem of requiring a treatment in vacuum, with the result that the equipments can hardly be controlled and electronic devices or active elements of electronic devices may be unfavorably affected by argon sputter.

(3) The laser beam-irradiated glazing method and the laser processing method disclosed in Japanese Patent Application Laying Open (KOKAI) 63-97382 will disadvantageously cause oxide film to grow during solidification of the metal surface because both methods force the metal texture on the surface to melt by a high energy laser beam in order to have abrasion resistance or denseness on the metal surface.

The surface treatment method disclosed in Japanese Patent Application Laying Open (KOKAI) 62-256961 can not be applied because it does not disclose the technique for removing oxide film.

The object of this invention is to solve the above problems of the prior art and provide a process for manufacturing electronic circuits, according to which soldering can be carried out without using flux by applying a metal surface treatment procedure which allows oxide film, organic matters, carbon or the like on the surfaces of metals to be easily removed without a complex process and without unfavorably affecting electronic devices, components or circuit substrates.

According to this invention, the above object is attained by a procedure of connecting an electronic device or component and a circuit substrate by means of solder, comprising the steps of irradiating said solder with a laser beam to clean said solder, aligning or registering, and mounting said electronic device on said circuit substrate, and hot-melting said solder in a low-oxygen content atmosphere to bond said electronic device and said circuit substrate with each other.

In this procedure, the surface of a metal such as solder is irradiated with a laser beam having a lower energy than the energy necessary to change the texture of the surface of the metal. Thus, only the bonds between metal atoms and oxygen atoms on the surface of the metal are broken or released by the energy of the laser beam to remove oxide film as well as organic matters, carbon, etc. on the surface while the metal texture on the surface remains unmolten.

Oxide film on the surface of the metal can successfully be removed whether the laser beam irradiation takes place in any of the atmospheres such as air or He gas, or in a vacuum.

Then, the electronic device or component and circuit substrate to be connected by solder are aligned or registered by a pre-setting liquid, and thereafter they are soldered together by hot-melting the solder from which has been removed oxide film in a low-oxygen content atmosphere. Thus, good soldering can be achieved without oxidizing soldered surfaces.

BRIEF DESCRIPTION OF THE DRAWINGS

FIG. 21 lists examples of the liquid used for pre-setting an electronic device.

DESCRIPTION OF THE PREFERRED EMBODIMENTS

The preferred embodiments of this invention will bow be described in detail by way of example with reference to the accompanying drawings.

Example 1

Figure 1:
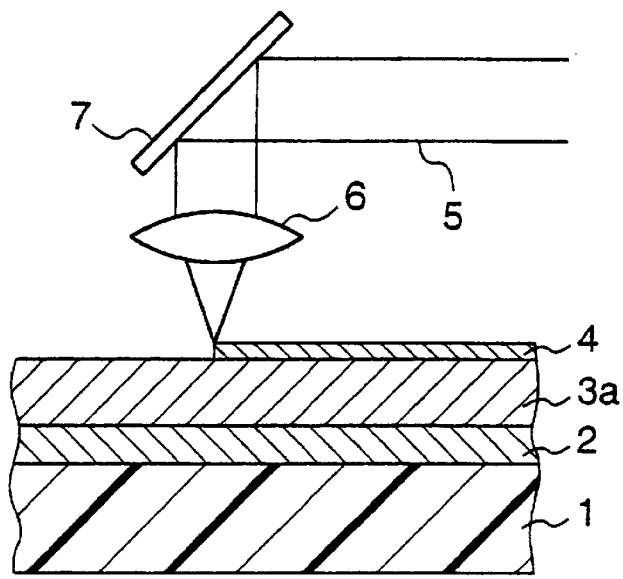
FIG. 1 is a sectional view for illustrating a metal surface treatment procedure according to Example 1 of this invention.

FIG. 1 is a sectional view for illustrating a metal surface treatment procedure or process or method according to Example 1 of this invention, which shows a ceramic substrate 1, a metallized layer 2, a solder layer 3a, oxide film or layer 4, laser beam 5, a lens 6, and a mirror 7.

According to the metal surface treatment procedure of the embodiment 1, the oxide 4 grown (or residues of organic matters, carbon, etc.) on the surface of the solder layer 3a on the surface of the metallized layer 2 formed on the top of the ceramic substrate 1 is removed as shown in FIG. 1.

The metallized layer 2 is made of, for example, a titanium (Ti), nickel (Ni), or nickel alloy film.

In order to remove the oxide 4 (or residues of organic matters, carbon, etc.) on the surface of the solder layer 3a, the surface of the solder layer 3a is irradiated with the laser beam 5 via the lens 6 and the mirror 7. The oxide 4 is thus removed.

Figure 2:
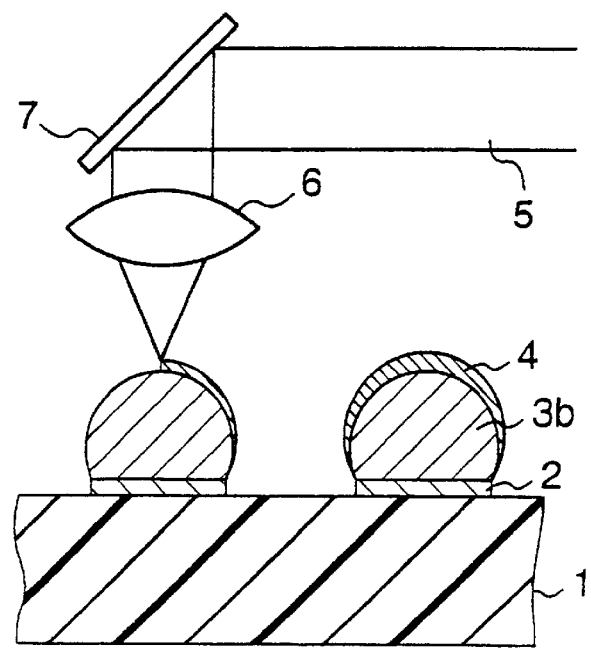
FIG. 2 is a sectional view for illustrating a variation or modification of Example 1 wherein the surfaces of solder bumps on a semiconductor integrated circuit (LSI) or the like are irradiated with a laser beam via a lens or mirror, instead of the solder layer of FIG. 1.

FIG. 2 shows a variation or modification of Example 1, wherein the surfaces of solder bumps 3b on a semiconductor integrated circuit (LSI) or the like are irradiated with laser beam 5 via a lens 6 and a mirror 7, instead of the solder layer 3a of FIG. 1.

The laser beam 5 used in Example 1 has a lower energy than the energy required to change the metallic texture or structure of the solder layer 3a or solder bumps 3b. More specifically, it has an energy which is higher than the bonding energy between Sn (tin) atoms and O (oxygen) atoms on the surface of the solder layer 3a or solder bumps 3b but lower than the bonding energy between Sn-Pb atoms.

When the solder layer 3a or a solder bump 3b is irradiated with such laser beam 5, only the bonds of Sn-Pb atoms with O atoms on the surface are broken or released by the energy of the laser beam 5 while the solder on the surface remains unmolten. The oxide film 4 on the surface of the solder layer 3a or solder bumps 3b is thus removed. Organic matters, carbon, etc. on the metal surface are also removed simultaneously.

Since the main purpose of the irradiation with the laser beam 5 herein is to break or release the bonds of Sn-Pb atoms with O atoms on the surface, the laser beam 5 is preferably a pulsed laser beam with a pulse width of 1 $\mu$s or less, for example.

Assuming that the bonds between Sn-Pb atoms and O atoms on the surface are broken by a pulsed laser beam with a pulse width of 1 $\mu$s or less, the laser beam 5 is preferably an excimer laser beam with short a wavelength (high photon energy), for example.

The oxide film 4 on the surface of the solder layer 3a or solder bumps 3b could be conveniently removed whether the irradiation with the laser beam 5 took place in any of the gaseous atmosphere such as air or He gas or in vacuum.

Figure 3:
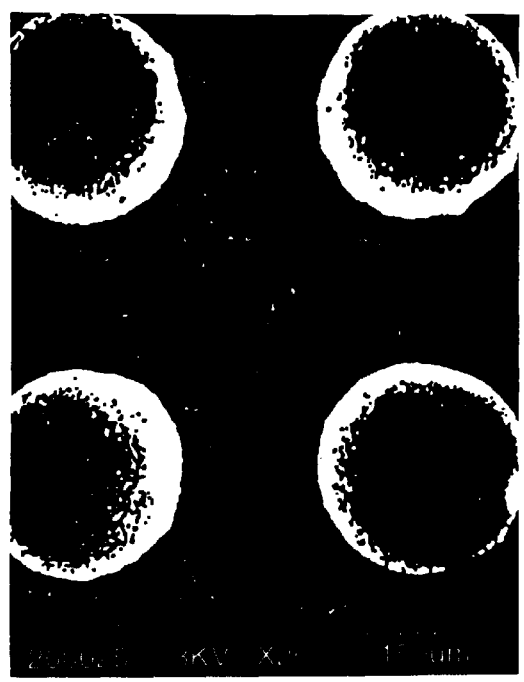
FIG. 3 is a scanning electron micrograph of the surface of the solder layer before irradiation with a laser beam according to Example 1.
Figure 4:
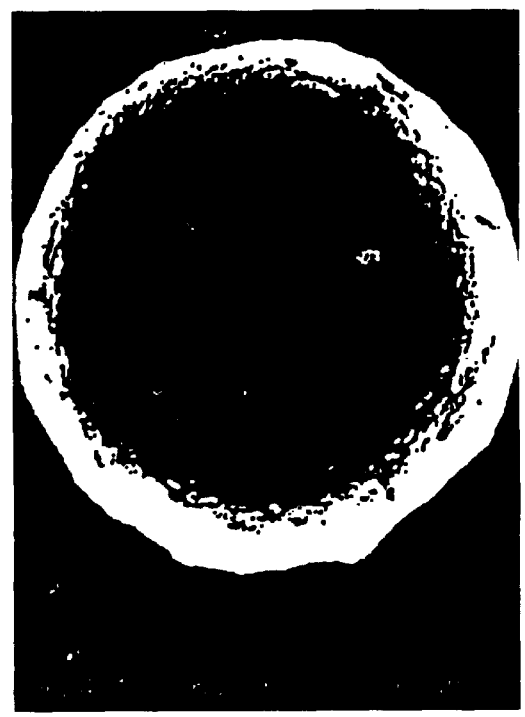
FIG. 4 is an enlarged photograph of FIG. 3.

FIG. 3 is a photograph of the surface state or condition of the solder layer 3a observed by a scanning electron microscope before irradiation with a laser beam, and FIG. 4 is an enlarged photograph of FIG. 3.

These photographs show black residues of organic matters or carbon, etc. on the surface of the solder layer 3a.

Figure 5:
FIG. 5 is a scanning electron micrograph of the surface of the solder layer after being irradiated with a laser beam according to the Example 1.
Figure 6:
FIG. 6 is an enlarged photograph of FIG. 5.

FIG. 5 is a photograph of the surface state or condition of the solder layer 3a similarly observed by a scanning electron microscope after irradiation with laser beam, and FIG. 6 is an enlarged photograph of FIG. 5.

These photographs show that residues of organic matters, carbon, etc. have been substantially wholly removed.

Figure 7:
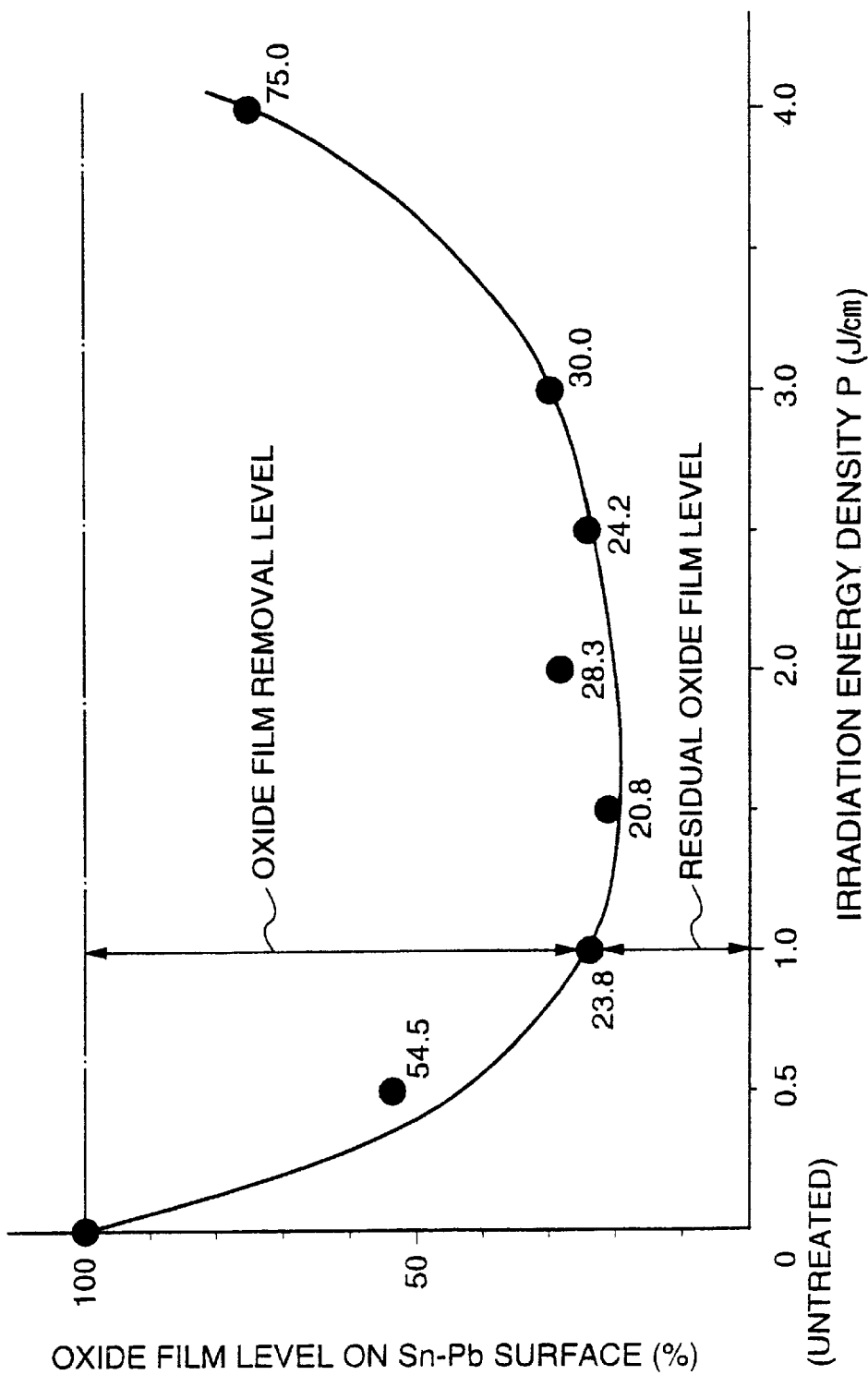
FIG. 7 is a graph plotting the relation between the oxide film level or proportion (%) on the Sn-Pb surface as ordinate and the laser beam irradiation energy density per pulse ($J/cm^2$) as abscissa in Example 1.

FIG. 7 is a graph plotting the relation between the oxide film level or proportion (%) on the Sn-Pb surface as ordinate and the laser beam irradiation energy density per pulse (J/cm$^2$) (laser beam irradiation energy per unit area) as abscissae.

FIG. 7 shows that the residual oxide film level is lower than the untreated oxide film level when the laser beam irradiation energy density ranges from 0.5 J/cm$^2$ to 4.0 J/cm$^2$, and especially reaches the minimum when the laser beam irradiation energy density is 1.5 J/cm$^2$.

The oxide film level herein is the oxygen content measured by energy diffusion X-ray spectroscopy (EDX).

Figure 8:
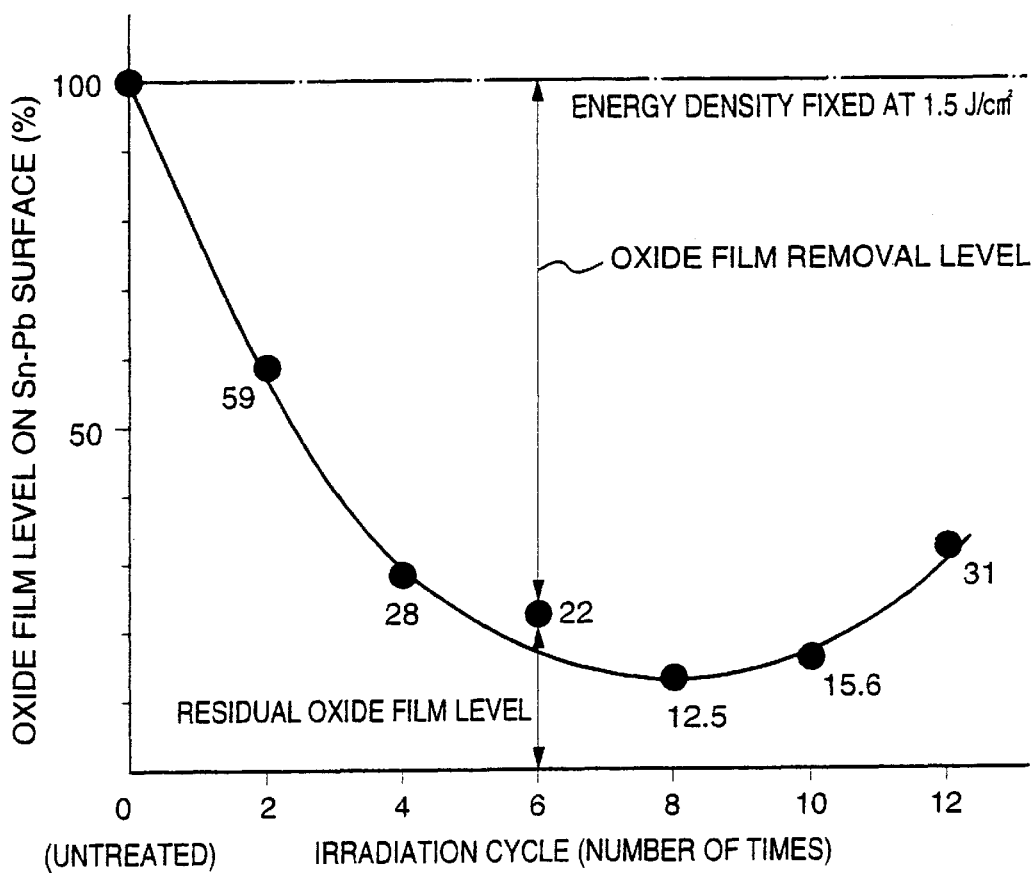
FIG. 8 is a graph plotting the oxide film level (%) on the Sn-Pb surface as ordinate and the irradiation cycle number (number of irradiations) at a fixed energy density of 1.5 ($J/cm^2$) as abscissa in Example 1.

FIG. 8 is a graph plotting the oxide film level or proportion (%) on the Sn-Pb surface as ordinate and the laser beam irradiation cycle number (i.e. number of times of irradiation) as abscissa when the laser beam irradiation energy density is fixed at 1.5 (J/cm$^2$).

FIG. 8 shows that the residual oxide film level is low when the irradiation cycle number ranges from 6 to 10, and especially reaches the minimum when the irradiation cycle number is 8.

These results prove that the oxide film level on the Sn-Pb surface reaches the minimum and the wettability of the solder layer 3a or solder bumps 3b is improved in a case where 8 cycles of laser beam irradiation are applied at an energy density of 1.5 J/cm$^2$.

Figure 9:
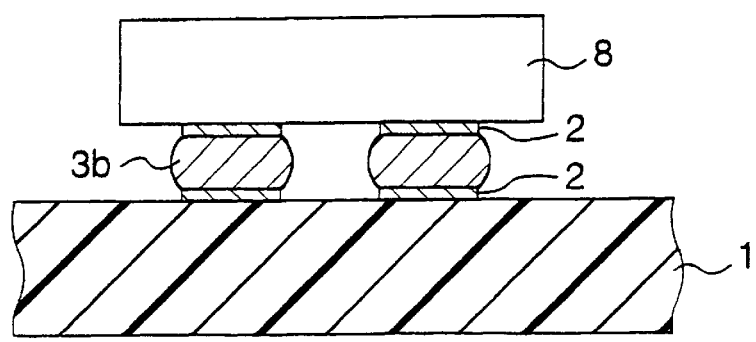
FIG. 9 is a sectional view showing an example of an electronic circuit soldered according to Example 1.
Figure 10:
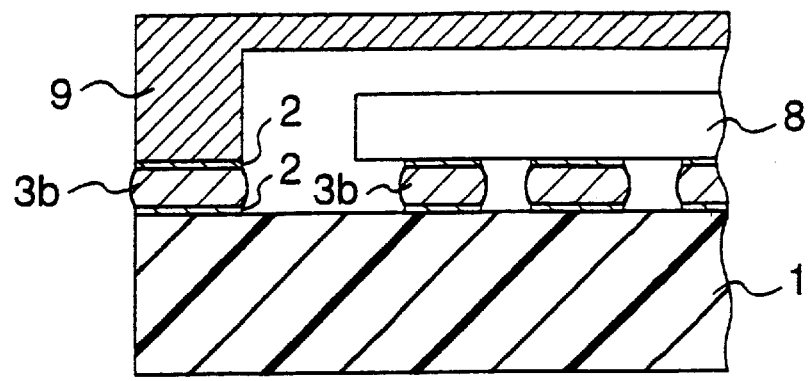
FIG. 10 is a sectional view showing another example of an electronic circuit soldered according to Example 1.

FIG. 9 shows a cross section of a main part of an electronic circuit made by flux-free soldering an integrated circuit (LSI) 8 onto a metallized layer 2 formed on the top of a ceramic substrate 1 after removing oxide film on the surface of solder bumps 3b according to the metal surface treatment procedure of Example 1, and FIG. 10 shows a cross section of a main part of an electronic circuit similarly made by flux-free soldering after removing oxide film on the surface of solder bumps 3b under a sealing cap 9.

Example 2

Figure 11:
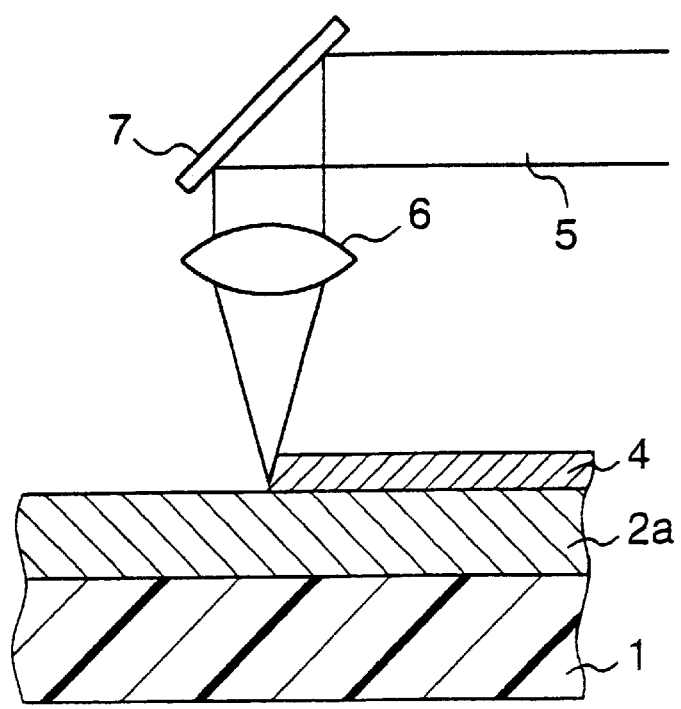
FIG. 11 is a sectional view for illustrating a metal surface treatment procedure according to Example 2 of this invention.

FIG. 11 is a sectional view for illustrating a metal surface treatment procedure or process or method according to Example 2 of this invention.

According to the metal surface treatment procedure of Example 2, an oxide 4 (or residues of organic matters, carbon, etc.) on the surface of a nickel (Ni) layer (or nickel alloy layer) 2a formed on the top of a ceramic substrate 1 is removed as shown in FIG. 11.

The nickel (Ni) layer (or nickel alloy layer) 2a is normally liable to be oxidized so that the oxide film 4 is readily formed on the surface of the nickel (Ni) layer or nickel alloy layer 2a.

In order to remove the oxide 4 on the surface of the nickel layer 2a, the surface of the nickel layer 2a is irradiated with laser beam 5 via the lens 6 and the mirror 7, in the same way as the above Example 1.

Figure 12:
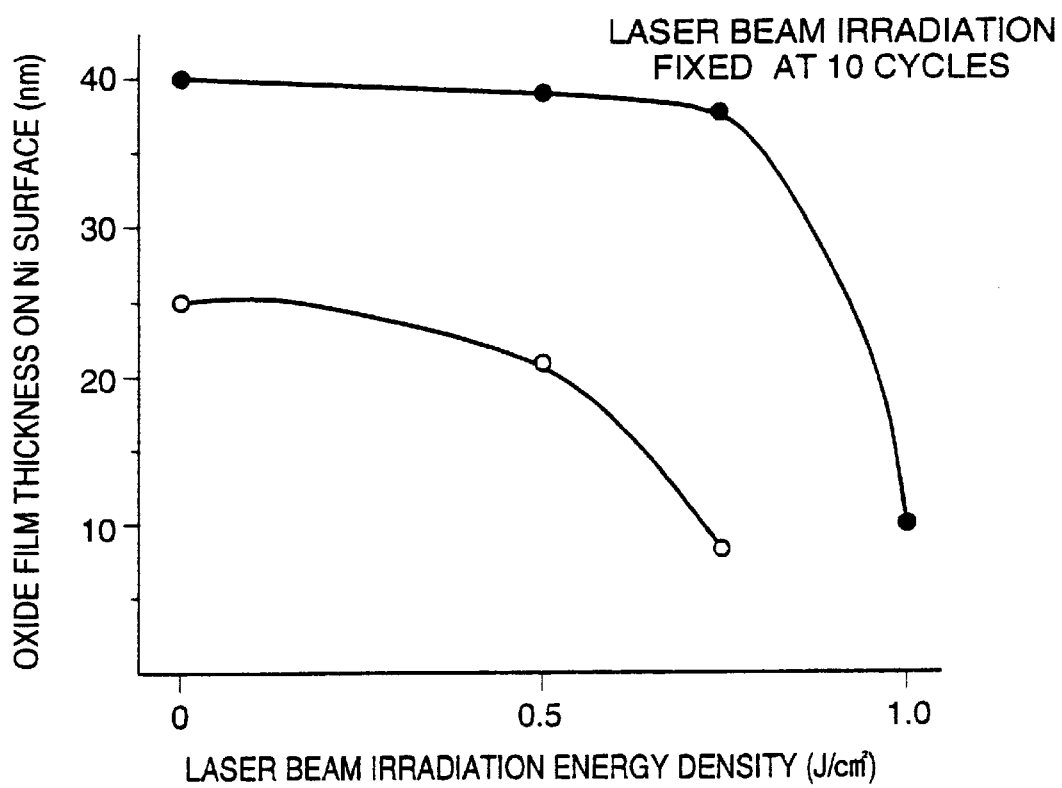
FIG. 12 is a graph plotting the relation between the thickness of the oxide film (nm) formed on the nickel layer as ordinate and the laser beam irradiation energy density ($J/cm^2$) as abscissa when the laser beam irradiation cycle number for the same zone of the nickel layer is fixed in Example 2.

FIG. 12 is a graph plotting, by way of example, the relation between the thickness (nm) of the oxide film 4 formed on the nickel layer 2a as ordinate and the laser beam irradiation energy density (J/cm$^2$) (laser beam irradiation energy per unit area) as abscissa when the cycle number of irradiation with the laser beam 5 for the same zone of the nickel layer 2a is fixed at 10.

FIG. 12 shows that a larger amount of oxide film can be removed as the irradiation energy density of the laser beam 5 increases, and that the oxide film 4 can be similarly removed even when the initial thickness of the oxide film is changed.

Figure 13:
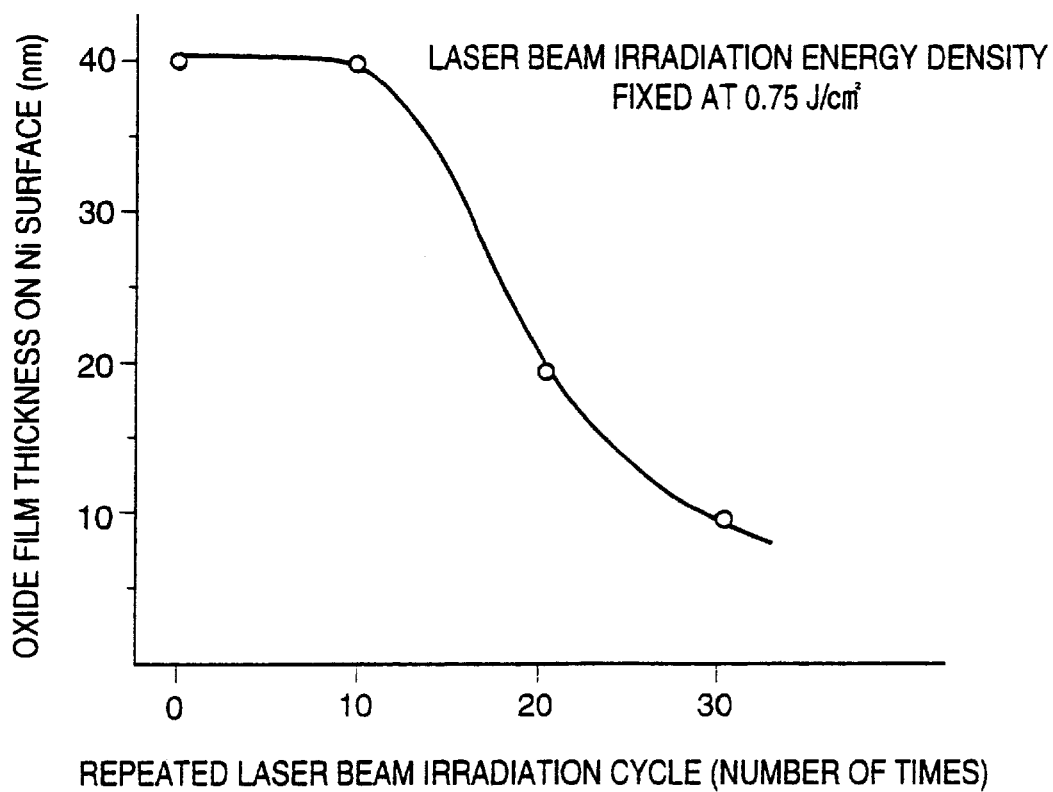
FIG. 13 is a graph plotting the relation between the thickness of the oxide film (nm) formed on the surface of the nickel layer as ordinate and the laser beam irradiation cycle number for the same zone of the nickel layer as abscissa when the laser beam irradiation energy density is fixed in Example 2.

FIG. 13 is a graph plotting, by way of example, the relation between the thickness of the oxide film 4 (nm) formed on the surface of the nickel layer 2a as ordinate and the laser beam irradiation cycle number for the same zone or area of the nickel layer 2a as abscissa when the irradiation energy density of the laser beam 5 is fixed at 0.75 (J/cm$^2$).

FIG. 13 shows that the thickness of the oxide film decreases as the irradiation cycle number increases.

Example 3

Figure 14:
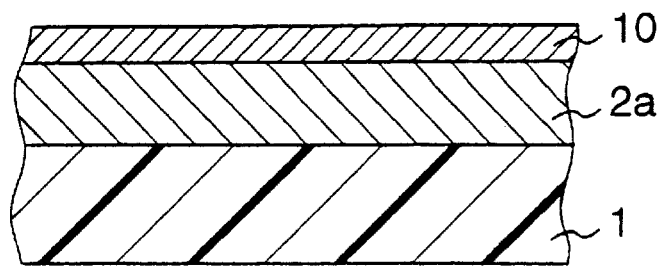
FIG. 14 is a sectional view for illustrating a process for making an electronic device according to Example 3 of this invention.

FIG. 14 is a sectional view for illustrating a process for making an electronic device such as semiconductor integrated circuit (LSI) according to Example 3 of this invention.

In Example 3, an oxide (or residues of organic matters, carbon, etc.) on the surface of a nickel (Ni) layer (or nickel alloy layer) 2a formed on the top of a ceramic substrate 1 is removed by the metal surface treatment procedure of the above Example 1 or 2, and then a plating layer 10 is applied, as shown in FIG. 14.

The plating may be any of electroplating, electroless plating or replacement plating, but the plating material herein is generally gold (Au) to prevent reoxidation.

The oxide film on the nickel (Ni) layer or nickel alloy layer 2a of metallized layer can thus be removed while preventing the layer from reoxidation.

Figure 15:
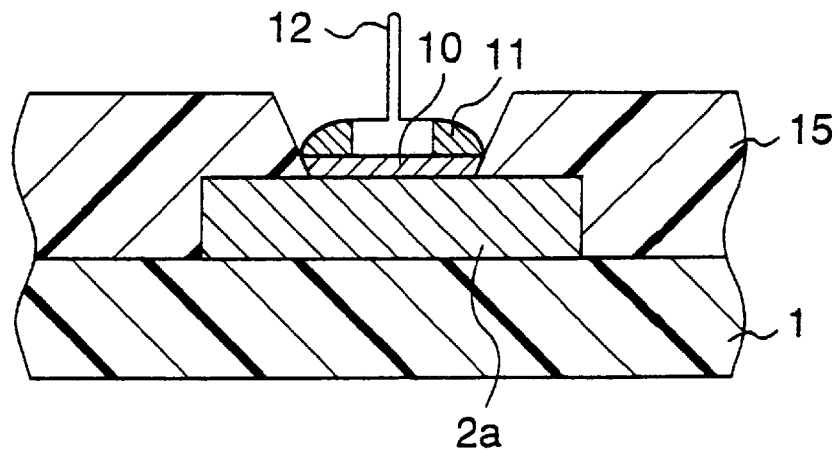
FIG. 15 is a configurative sectional view of an electronic device to which the anti-reoxidizing means has actually been applied in Example 3.

FIG. 15 shows a configurative sectional view of an electronic device to which the anti-reoxidizing means of Example 3 has actually been applied.

In the process of Example 3, a nickel (Ni) layer (or nickel alloy layer) 2a of metallized layer is formed on a ceramic substrate 1 and an organic insulating layer 15 is applied thereon. This organic insulating layer 15 is perforated to expose said nickel (Ni) layer 2a and an oxide film on the surface of thus exposed nickel (Ni) layer 2a is removed by the surface treatment procedure of the above Example 1 or 2, and thereafter an anti-reoxidizing plating layer 10 is applied. Then, an input/output (I/O) pin 12 is bonded by solder 11.

As a result of applying the anti-reoxidizing plating layer 10 after removing the oxide on the surface of the nickel alloy layer 2a, a good electric connection can be achieved between the input/output (I/O) pin 12 of a semiconductor integrated circuit (LSI) or the like and the ceramic substrate 1.

The input/output (I/O) pin 12 and the nickel (Ni) layer 2a on the ceramic substrate 1 can be electrically connected in good conditions by the solder 11 without applying the anti-reoxidizing plating layer (Au plating) 10 within about one week after the oxide film 4 has been removed by laser beam 5.

Figure 16:
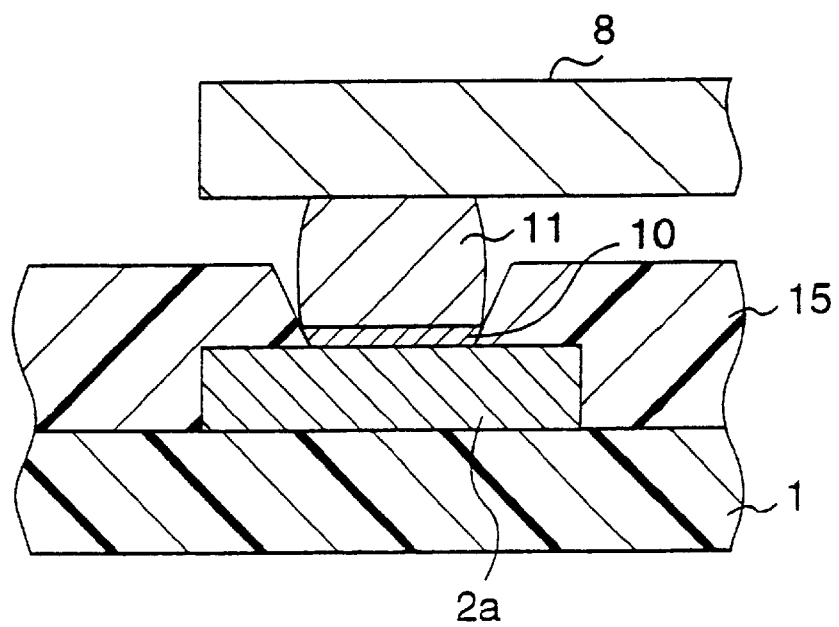
FIG. 16 is a sectional view showing an example wherein an electronic device and a nickel (Ni) layer or nickel alloy layer on a ceramic substrate are directly electrically connected by solder without using an input/output (I/O) pin of FIG. 15.

FIG. 16 shows a case where an electronic device and a nickel (Ni) layer 2a on a ceramic substrate 1 are directly electrically connected by solder 11 without using an inlet/outlet (I/O) pin 12 shown in FIG. 15.

Conventionally, such a connection always required fluxes, but the process of Example 3 eliminates the necessity of fluxes.

Example 4

Figure 17A:
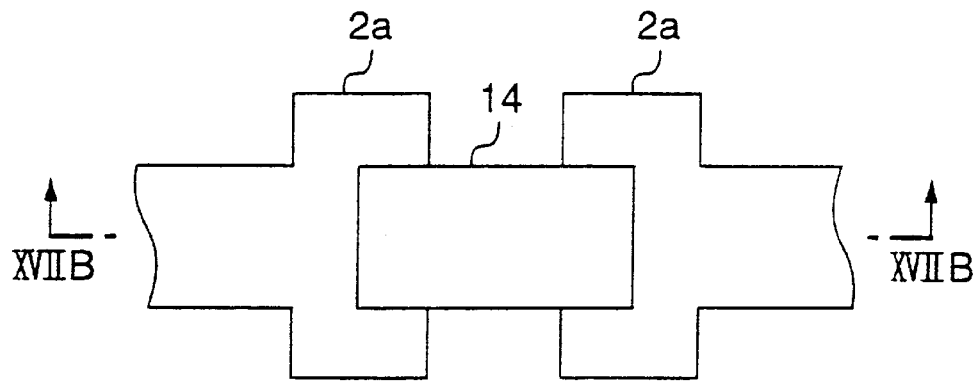
FIG. 17A is a plan view for illustrating a process for making an electronic circuit according to Example 4 of this invention.
Figure 17B:
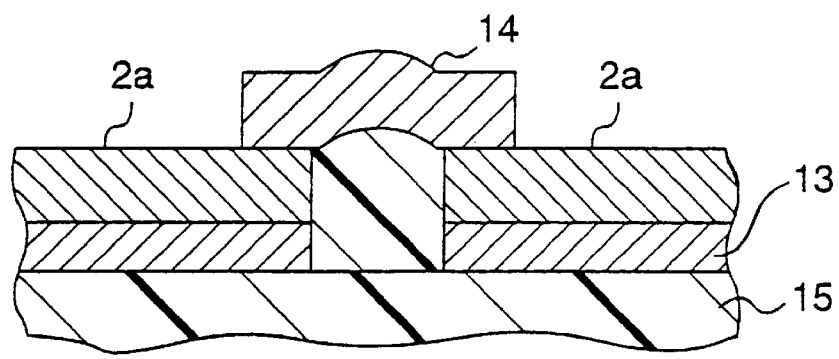
FIG. 17B is a sectional view taken along a line XVIIB—XVIIB of FIG. 17A.

FIGS. 17A and 17B illustrate a process for making an electronic device such as semiconductor integrated circuit according to Example 4 of this invention, wherein FIG. 17A is a plan view and FIG. 17B is a sectional view taken along the line XVIIB—XVIIB of FIG. 17A.

In the process of Example 4, a metal film 13 (for example, chromium (Cr), titanium (Ti)) with good adhesive properties to an organic insulating or dielectric layer 15 is formed on the organic insulating layer 15 and a nickel (Ni) layer (or nickel alloy layer) 2a is applied thereon, as shown in FIGS. 17A and 17B. Oxide (or resudues of organic matters, carbon, etc.) on the surface of this nickel (Ni) layer (or nickel alloy layer) 2a is removed by the surface treatment procedure of the above Example 1 or 2, and thereafter a gold (Au) ribbon or gold (Au) wire 14 is bonded by ultrasonic heat pressure technique.

Such bonding has been usually difficult on the nickel (Ni) layer or nickel alloy layer 2a due to the presence of oxide film on the surface, but good bonding can be achieved as a result of removing the oxide by the procedure of the above Example 1 or 2.

Although the foregoing Examples include the metal surface treatment of the solder layer 3a or nickel (Ni) layer 2a, this invention is not limited to these Examples but may be applied to various metals from which oxide film or organic matters should be removed.

The laser beam energy may be suitably controlled depending on the nature or property of the metal material.

Although a pulsed laser beam was mentioned above as an example, similar effects can be achieved by continuous irradiation with a laser beam having a longer wavelength such as CO, lasers provided that appropriate controlling means is added to prevent the metal texture itself from melting.

The laser irradiation may cause the metal texture on the surface to melt, but it is permissible so far as it only lasts briefly.

Example 5

Figure 18:
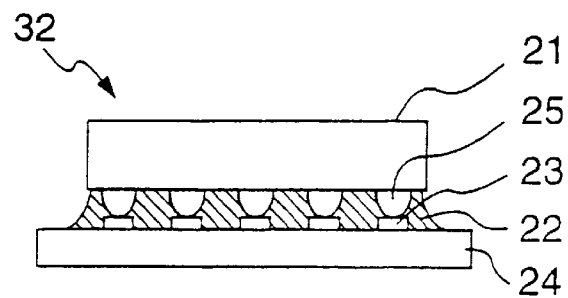
FIG. 18 is a sectional view showing the configuration of a circuit substrate on which has been pre-set an electronic device to be soldered by a manufacturing apparatus according to an embodiment of this invention.
Figure 19:
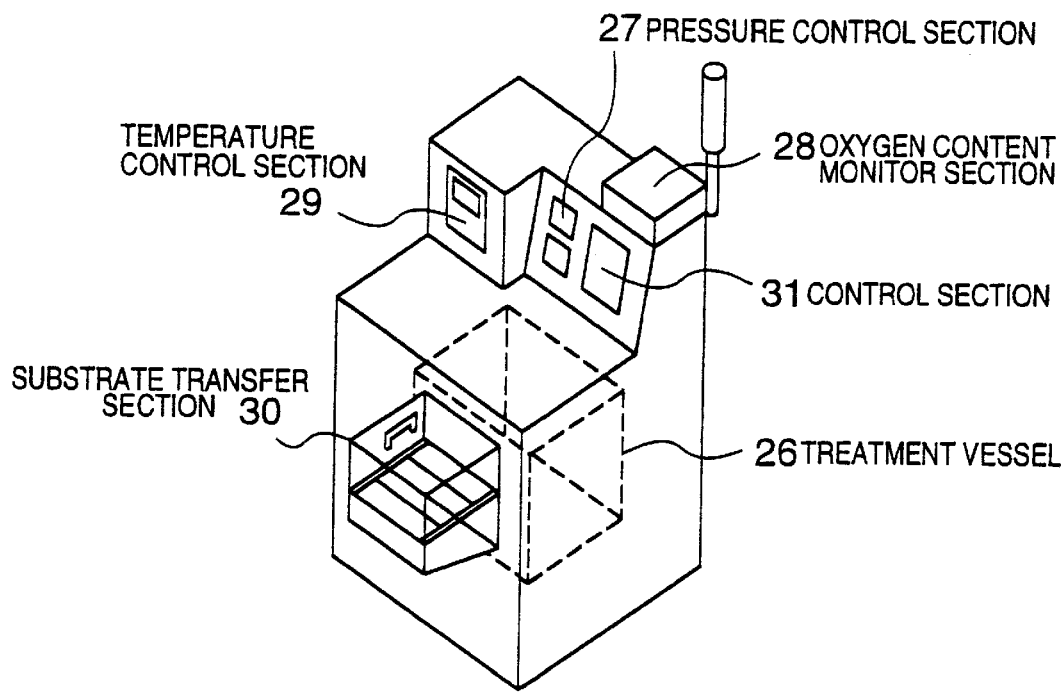
FIG. 19 is a perspective view showing the configuration of an apparatus for manufacturing electronic circuits according to an embodiment of this invention.
Figure 20:
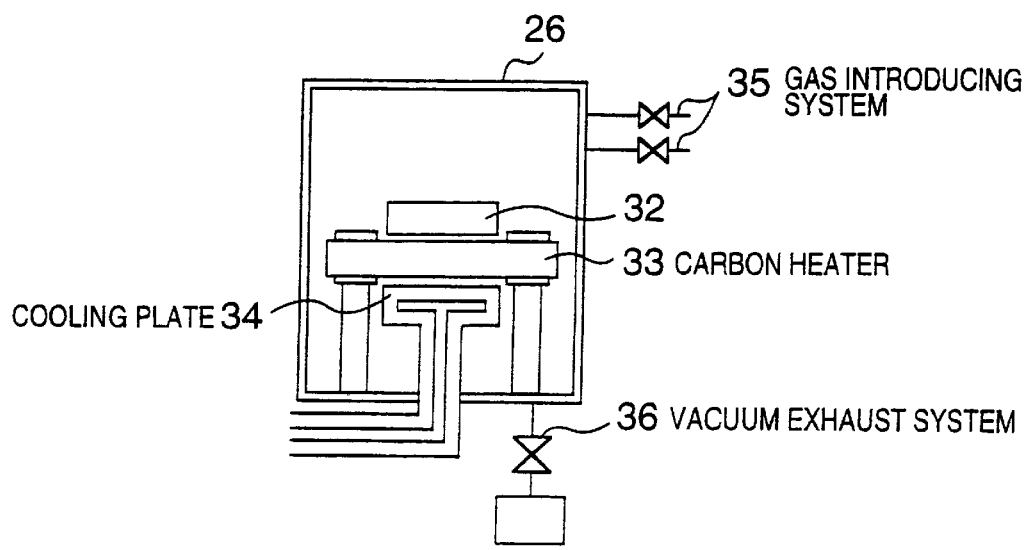
FIG. 20 is a sectional view showing an inside of a treating vessel.

FIG. 18 is a sectional view showing a configuration or structure of a circuit substrate on which has been pre-set an electronic device to be soldered by a manufacturing apparatus according to an embodiment of this invention, FIG. 19 is a perspective view showing a configuration or structure of an apparatus for manufacturing electronic circuits according to an embodiment of this invention, FIG. 20 is a sectional view showing an inside or inner structure of a treating vessel, and FIG. 21 lists examples of the liquid used for pre-setting an electronic device.

FIGS. 18 to 20 show an electronic device 21, a liquid 22 for pre-setting the electronic device 21, lands 23 for electric connection, a circuit substrate 24, solder 25, a treating vessel 26, a pressure controlling section 27, an oxygen content monitoring section 28, a temperature controlling section 29, an electronic circuit substrate transferring section 30, a controlling section 31, an electronic circuit substrate to be treated 32, a carbon heater 33, a cooling plate 34, a gas introducing system 35, and a vacuum exhaust or evacuation system 36.

As shown in FIG. 18, the electronic circuit substrate structure to be treated 32 formed of an electronic device and a circuit substrate which are to be soldered together according to the embodiment of this invention comprises the electronic device 21 such as an LSI provided with solder bump terminals of solder 25 and pre-set on the circuit substrate 24 made from ceramic, glass or epoxy, etc. by the liquid 22 for pre-setting the electronic device 21 thereon. The electronic device 21 and the circuit substrate 24 are aligned or registered so that each of the lands 23 on the circuit substrate 24 to be soldered and the corresponding solder 25 on the electronic device 21 may be matched with each other.

As shown in FIG. 19, an apparatus for manufacturing electronic circuits wherein the electronic circuit substrate to be treated 32 formed of the electronic device 21 pre-set on the circuit substrate 24 is treated to bond solder 25 on the electronic device 21 with the lands 23 on the circuit substrate 24 according to the embodiment of this invention as described above comprises the treating vessel 26 for carrying out soldering by heating, cooling or otherwise treating the electronic circuit substrate to be treated 32 as shown in FIG. 18, the pressure controlling section 27 for controlling the evaporation rate of the liquid 22, the oxygen content monitoring section 28 for monitoring the oxygen content in a low-oxygen content or concentration atmosphere formed in the treating vessel 26, the temperature controlling section 29 for the carbon heater 33 heating the electronic circuit substrate to be treated 32, the electronic circuit substrate transferring section 30 for automating a series of transfer operations and the controlling section 31 for automatically controlling the whole apparatus.

As shown in FIG. 20, the treating vessel 26 contains therein the carbon heater 33 for heating an electronic circuit substrate to be treated 32, and the water-cooled metallic cooling plate 34 for cooling the heated carbon heater 33 and the electronic circuit substrate to be treated 32. The electronic circuit substrate to be treated 32 is disposed and treated on the carbon heater 33.

The gas introducing system 35 and the vacuum exhaust or evacuation system 36 are connected to the treatment vessel 26 to control the treatment atmosphere inside the treating vessel 26.

The treating vessel 26, gas introducing system 35, vacuum exhaust system 36 and heating means such as the carbon heater 33 constitute a reflow heating system.

Now, a soldering process using an apparatus for manufacturing electronic circuits according to the embodiment of this invention is described below.

At first, a precontrolled amount of the liquid 22 is fed onto the circuit substrate 24 by a dispenser (not shown). This feed amount is controlled to be capable of covering the solders 25 and the lands 23 but not to move up the electronic device 21 even by the surface tension of the liquid 22 or other action. Then, the electronic device 21 such as an LSI is mounted on the circuit substrate 24 so that the solder 25 provided beforehand on the circuit substrate 24 may be aligned or registered with the corresponding or respective lands 23 on the electronic device 21 coated with the liquid 22.

The circuit substrate 24 carrying the electronic device 21 forms an electronic circuit substrate to be treated 32 as shown in FIG. 18, which is then placed in the electronic circuit substrate transferring section 30 of the manufacturing apparatus of FIG. 19. The electronic circuit substrate to be treated 32 placed in the electronic circuit substrate transferring section 30 is transferred by a sort of robot, such as a program-controlled manipulator or transfer mechanism, onto the carbon heater 33 in the treating vessel 26, as shown in FIG. 20.

Then, the gas in the treating vessel 26 is exhausted or evacuated by a vacuum exhaust system 36 formed of a rotary pump or the like and a non-oxidizing gas such as He, nitrogen (N) or a reducing gas such as a mixture of hydrogen (H) and nitrogen (N) is introduced via a flow- and pressure-controllable gas introducing system 35 to once restore the inside of the treating vessel 26 to atmospheric pressure. If the oxygen content (concentration) within the treating vessel 26 as measured by the oxygen content monitoring section 28 is not lowered to a predetermined level (preferably 10 ppm or less), the above vacuum exhaustion and gas introducing steps are repeated until the predetermined low-oxygen content atmosphere is formed. The low-oxygen content atmosphere has an effect of inhibiting the oxidation of the circuit substrate 24, lands of the electronic device 21 and solder 25 on the electronic circuit substrate to be treated 32 during heating.

After the low-oxygen content atmosphere has been formed in the treating vessel 26, the electronic circuit substrate to be treated 32 is heated by direct thermal conduction from the carbon heater 33 while the occurrence of abnormalities is constantly monitored during heating. This heating is controlled at a temperature higher than the melting point of the solder 25 by the temperature controlling section 29. When the melting point of the solder 25 is 221° C., for example, the temperature of the carbon heater 33 is set at 250° C.

When the heating starts, the liquid 22 used for pre-setting the electronic device 21 on the circuit substrate 24 begins to evaporate. If it is desired to promote or suppress this evaporation, the pressure of the gas introduced to form a low-oxygen content atmosphere as described above may have been set lower or higher than atmospheric pressure. After the solder 25 melts and soldering is completed, cooling water is supplied to the water-cooled metallic cooling plate 34 to cool the heated carbon heater 33 and electronic circuit substrate to be treated 32, and then the electronic circuit substrate to be treated 32 is taken out by the substrate transferring section 30.

Now, a process for soldering the electronic device 21 to the circuit substrate 24 is specifically explained, which enables to omit the cleaning step after soldering by allowing the liquid 22 on the electronic circuit substrate to be treated 32 to completely evaporate by using the manufacturing apparatus according to an embodiment of this invention.

In one embodiment of this invention, a solder having a melting point of 221° C. is used and the temperature of the carbon heater 33 is set at 250° C.

As the liquid for pre-setting the electronic device 21 on the circuit substrate 24, a rosin-free alcoholic liquid as shown in FIG. 21 may be used, for example.

The liquid A shown in FIG. 21 is ethylene glycol having a boiling point of 197° C. which is relatively lower than the melting point 221° C. of the solder 25 used. Such a liquid begins to evaporate as the temperature of the electronic circuit substrate to be treated 32 rises after the carbon heater 33 starts to heat it. In this embodiment which uses the solder having a melting point of 221° C. and the carbon heater 33 rising up to 250° C., the liquid will have completely evaporated before soldering is completed. Once the liquid has completely evaporated and the solder 25 has been completely molten to complete soldering, cooling water is supplied to the cooling plate 34 to cool the heated carbon heater 33 and electronic circuit substrate to be treated 32 and then the electronic circuit substrate to be treated 32 is removed or taken out by the substrate transferring section 30.

If the electronic device 21 has been pre-set on the circuit substrate 24 by the liquid having a boiling point relatively lower than the melting point of the solder 25 used as described above, the soldering can be carried out without leaving any trace of the liquid used for pre-setting and therefore the cleaning step after soldering can be omitted according to this embodiment.

On the contrary, the liquid B shown in FIG. 21 is triethylene glycol having a boiling point of 287° C., which is relatively higher than the melting point 221° C. of the solder 25 used. Such liquid slowly evaporates even if the temperature of the electronic circuit substrate to be treated 32 rises after the carbon heater 33 starts to heat it, and the liquid will not completely evaporate and will be left after soldering is completed.

In order to solve this problem, the treating vessel 26 is evacuated to lower its inner pressure after soldering is completed. This allows the liquid to have completely evaporated before the electronic circuit substrate to be treated 32 is cooled by the cooling plate 34, and enables to omit the cleaning step after soldering similarly to the case which uses the liquid A.

The evaporation rate of the liquid A or B is regulated by controlling the pressure in the treating vessel 26 so that the liquid which has pre-set the electronic device may be left until the solder melts during soldering but the liquid may have completely evaporated when soldering is completed by the molten solder. Since the liquid is left until the solder melts, solder joints can be protected against oxidation and more reliable soldering can be carried out even in an atmosphere containing some level of oxygen.

As apparent from the foregoing description, this invention allows oxide film on the surface of metal to be removed without using flux by irradiating the surface of the metal such as solder with a laser beam having a lower energy than the energy changing the texture of the surface of the metal.

This invention also prevents the oxidation of circuit substrates, lands or contact pads of electronic devices and solder during heating and ensures more reliable soldering by pre-setting an electronic device and a circuit substrate by a specific liquid and hot-melting solder in a low-oxygen content atmosphere.

Finally, this invention enables to omit the cleaning process using flux such as chlorofluorocarbons, and thus enables to prevent harmful influences on the global environment as well as to reduce production equipment and production steps.

What is claimed is:

1. An apparatus for manufacturing an electronic circuit substrate by hot-melting bump terminals of a solder material formed on an electronic device to connect surfaces of the electronic device and of a circuit substrate to each other, said apparatus comprising a treating vessel adapted to receive therein said electronic circuit substrate, pressure control means for controlling a pressure in said treating vessel, heating means provided in said treating vessel, transfer means for transferring into said treating vessel the electronic circuit substrate, in which said electronic device is temnorarily fixed on said circuit substrate by means of an alcoholic solution supplied in a manner to cover the connecting surface of said circuit substrate and the solder terminals on said electronic device, and apparatus control means for controlling an evaporation rate of said alcoholic solution for solder bonding by permitting said heating means to heat said electronic circuit substrate transferred into said treating vessel by said transfer means and permitting said pressure control means to control a pressure in said treating vessel.

2. The apparatus according to claim 1, wherein said pressure control means comprises evacuation means and gas introducing means, and can create an atmosphere containing a predetermined low concentration of oxygen within said treating vessel.

3. The apparatus according to claim 1, wherein said apparatus control means controls said heating means and said pressure control means in such a manner to inhibit evaporation of at least a part of said alcoholic solution until said solder material is subjected to hot-melting to connect said electronic device and said circuit substrate to each other, and to allow said alcoholic solution to evaporate after said electronic device and said circuit substrate are connected to each other.

4. The apparatus according to claim 3, wherein said apparatus control means causes said pressure control means to decrease a pressure in said treating vessel in order to evaporate said alcoholic solution after said electronic device and said circuit substrate are connected to each other.

5. The apparatus according to claim 3, wherein said alcoholic solution has a higher boiling point than a melting point of said solder material.

\* \* \* \* \*